United States Patent
Furukawa et al.

(10) Patent No.: US 7,123,080 B2
(45) Date of Patent: Oct. 17, 2006

(54) DIFFERENTIAL AMPLIFICATION INPUT CIRCUIT

(75) Inventors: Atsushi Furukawa, Tokyo (JP); Takuya Saito, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/077,876

(22) Filed: Mar. 10, 2005

(65) Prior Publication Data

US 2006/0202748 A1    Sep. 14, 2006

(51) Int. Cl.
*H03F 3/45* (2006.01)
*H03F 1/34* (2006.01)

(52) U.S. Cl. .............. 327/536; 327/87; 330/69

(58) Field of Classification Search .......... 327/77, 327/87–89, 563; 330/69, 98–100, 252–253, 330/258, 260, 301
See application file for complete search history.

(56) References Cited

U.S. PATENT DOCUMENTS

| | | | |
|---|---|---|---|
| 4,158,178 A | * | 6/1979 | Schade, Jr. ............. 330/253 |
| 4,480,230 A | * | 10/1984 | Brehmer et al. ........... 330/255 |
| 5,315,266 A | * | 5/1994 | Lorenz ..................... 330/294 |
| 6,229,348 B1 | * | 5/2001 | Matsumoto ................ 327/67 |

FOREIGN PATENT DOCUMENTS

| | | |
|---|---|---|
| JP | 7-67053 | 7/1995 |
| JP | 3154459 | 2/2001 |

* cited by examiner

*Primary Examiner*—Timothy P. Callahan
*Assistant Examiner*—Terry L. Englund
(74) *Attorney, Agent, or Firm*—Sughrue Mion, PLLC

(57) ABSTRACT

An input circuit has a differential amplification circuit which converts a differential signal to a single end signal to output the single end signal, an attenuation circuit which attenuates a first input signal to output the attenuated signal to the differential amplification circuit, a capacitor in which one end thereof is connected to a first input terminal to which the first input signal is inputted, and another end thereof is connected to an output side of the differential amplification circuit, a buffer to which the single end signal outputted from the differential amplification circuit and a signal transmitted through the capacitor are inputted, and which outputs the output signal, and a feedback circuit which outputs a signal based on an output signal outputted from the buffer and the second input signal to the differential amplification circuit.

8 Claims, 3 Drawing Sheets

DIFFERENTIAL AMPLIFICATION INPUT CIRCUIT

CROSS-REFERENCE TO RELATED APPLICATIONS

This application is based upon the prior Japanese Patent Applications No. 2003-424761, filed on Dec. 22, 2003, the entire contents of which are incorporated herein by reference.

BACKGROUND OF THE INVENTION

1. Field of the Invention

The present invention relates to an input circuit to which a first input signal and a second input signal are inputted from two input terminals and which outputs an output signal acquired by performing differential amplification of the first input signal and the second input signal from an output terminal. The present invention particularly relates to an input circuit which has a wide band of frequency characteristic and a large voltage range for input, with a high input impedance.

2. Description of the Related Art

The input circuits for the electronic measurement apparatuses, including an oscilloscope, need a so-called buffer amplifier for buffering to be less affected by the measured system (e.g., refer to JP-B-7-67053 and Japanese Patent No. 3154459). Particularly, in the case of an input circuit used in the oscilloscope, it is required to perform the offset adjustment for changing the voltage level of a DC (Direct Current) signal in a measuring signal so that the voltage range of the measuring signal from the measured system falls within the voltage range that can be treated by the input circuit and following circuits. The offset adjustment is implemented by providing the input circuit with a differential amplification circuit.

Also, it is required that the input circuit has a high input impedance to have no influence on the measured system. That is, it is required that the voltage of the measured system is only detected to keep the current flowing from a measured object into the input circuit. This is implemented by using a Field Effect Transistor (FET) at the first stage of the differential amplification circuit.

FIG. 3 is a block diagram of a conventional input circuit, and FIG. 4 is a circuit diagram of the input circuit as shown in FIG. 3. In FIGS. 3 and 4, an input terminal Ti1 is one input terminal of the input circuit, to which a measuring signal (first input signal) is applied from the measured system. An offset adjustment circuit 10 outputs an offset signal (second input signal). An input terminal Ti2 is the other input terminal of the input circuit, to which the offset signal is applied. A differential amplification circuit 20 has two inputs and one output, in which the measuring signal from the input terminal Ti1 is inputted into one input side and the offset signal (normally a DC signal) from the input terminal Ti2 is inputted into the other input side. And a signal corresponding to a voltage difference between the measuring signal and the offset signal is outputted from the output side to an output terminal To. The output terminal To is for the input circuit. A preamplifier circuit 30 is a circuit provided at the latter stage of the input circuit, with the input side connected to the output terminal To.

The differential amplification circuit 20 will be described below in detail.

A p-channel MOS-FET Q1 has the source connected via a constant current source Is to a power cable Vcc at a predetermined voltage level, and the drain connected to a power cable Vee at a predetermined voltage level. Also, the gate of the FET Q1 is one input end connected to the input terminal Ti1.

A p-channel MOS-FET Q2 has the source connected via a constant current source Is' to the power cable Vcc at the predetermined voltage level, and the drain connected to the power cable Vee at the predetermined voltage level. Also, the gate of the FET Q2 is the other input end connected to the input terminal Ti2.

A differential signal/single end signal converter 21 is connected to the source of FET Q1, Q2, and converts a differential signal into a single end signal which is outputted via the output terminal To to the preamplifier circuit 30.

The operation of the above circuit will be described below.

A measuring signal from the measured system is inputted via the input terminal Ti1 into the gate of the FET Q1 in the differential amplification circuit 20. On the other hand, an offset signal of desired voltage level is inputted from the offset adjustment circuit via the input terminal Ti2 to the gate of the FET Q2 in the differential amplification circuit 20.

And a voltage following the voltage applied to each gate of the FET Q1, Q2 appears at the source of the FET Q1, Q2. Thus, the differential signal/single end signal converter 21 outputs a single end signal that is a voltage of the measured signal subtracted (or added) by a voltage of the offset signal via the output terminal To to the preamplifier circuit 30.

JP-B-7-67053 (pages 1 to 3, FIGS. 1 and 2) and Japanese Patent No. 3154459 (pages 1 and 2, FIG. 3) are referred to as related art.

Thus, the differential amplification circuit 20 has a high input impedance by using the FET Q1, Q2 at the first stage. Also, the frequency (so-called frequency characteristic) of the differential amplification circuit 20 to be transferred to the preamplifier circuit 30 at the latter stage is limited by the FET Q1, Q2. This frequency characteristic is typically about several hundreds [MHz].

However, in the case of measuring the high frequency signal (e.g., at least 1 [GHz]) with the oscilloscope, the differential amplification circuit 20 was difficult to transfer the high frequency signal to the preamplifier circuit 30 correctly.

If the FET Q1, Q2 are manufactured as the ordered products by altering the semiconductor design or manufacturing method of the FET Q1, Q2, the frequency characteristic may be enhanced. However, the rated range of input voltage (i.e., voltage range of FET Q1, Q2 into the gate) is narrowed. Therefore, the adjustment for large offset amounts could not be made to narrow the voltage range of measuring signal.

SUMMARY OF THE INVENTION

The object of the invention is to provide an input circuit having a wide band of frequency characteristic and a large voltage range for input, with a high input impedance.

The invention provides an input circuit, having: a first input terminal to which a first input signal is inputted; a second input terminal to which a second input signal is inputted; an output terminal from which an output signal acquired by performing differential amplification between the first input signal and the second input signal is outputted; a differential amplification circuit which converts a differential signal into a single end signal to output the single end signal; an attenuation circuit which attenuates the first input signal to output the attenuated signal to the differential amplification circuit; a capacitor in which one end thereof is connected to the first input terminal, and another end thereof is connected to an output side of the differential amplification circuit; a buffer to which the single end signal outputted from the differential amplification circuit and a signal transmitted through the capacitor are inputted, and which outputs the output signal; and a feedback circuit which outputs a signal based on an output signal outputted from the buffer and the second input signal to the differential amplification circuit.

In the input circuit, the attenuation circuit has: a first resistor in which one end thereof is connected to the first input terminal, and another end thereof is connected to an input side of the differential amplification circuit; and a second resistor in which one end thereof is connected to a common potential point, and another end thereof is connected to the another end of the first resistor.

In the input circuit, the feedback circuit has: a third resistor in which one end thereof is connected to the second input terminal, and another end thereof is connected to an input side of the differential amplification circuit; a fourth resistor in which one end thereof is connected to a common potential point, and another end thereof is connected to the another end of the third resistor; and a fifth resistor in which one end thereof is connected to an output side of the buffer, and another end thereof is connected to the another end of the third resistor.

In the input circuit, the differential amplification circuit has a differential pair of p-channel MOS-FETs at the first stage, wherein a signal outputted from the attenuation circuit is inputted to a gate of one of the MOS-FETs, and a signal outputted from the feedback circuit is inputted to a gate of another MOS-FET.

In the input circuit, the signal inputted to the buffer through the capacitor is a signal of high frequencies in the first input signal, which is incapable of transferring through the differential amplification circuit.

In the input circuit, the second input signal is an offset signal which makes an offset adjustment for the first input signal.

In the input circuit, the input circuit is employed for an electronic measurement apparatus which measures an electric signal.

In the input circuit, the input circuit is employed for a signal processor which performs a signal processing of an electric signal.

According to the input circuit, since the differential amplification circuit functions a composite amplifier using the capacitor, it is possible to transfer a high frequency signal which is incapable of transferring through the differential amplification circuit. Further, since the attenuation circuit attenuates the first input signal to input the attenuated signal into the differential amplification circuit, the input voltage range for the differential amplification circuit is increased. Thus, it is possible to provide the input circuit having the wide band of frequency characteristic including the DC signal, and the wide voltage range for input, with high input impedance.

Further, since the feedback circuit can feed back the output signal, the second input signal is stably inputted to the differential amplification circuit. Thus, the differential amplification between the first and second input signals can be stably performed.

Further, since the attenuation circuit is configured from high resistances, the high input impedance is kept.

Further, since the feedback circuit has one end of the fourth resistor connected to the common potential point to attenuate the second input signal, the influence of noise in the second input signal reduces.

Further, since a differential pair of p-channel MOS-FETs are employed at the first stage of the differential amplification circuit, the high input impedance is provided.

Further, since the high frequency component of the first input signal is transferred through the capacitor, it is possible to transfer the first input signal into the buffer with constant characteristic without depending on the frequency, even if the first input signal includes the high frequency component not transferable by the differential amplification circuit.

Further, since the second input signal makes the offset adjustment of the first input signal to the desired voltage level, the first input signal can be within the voltage range to be treated by the input circuit and following circuits.

Further, in the case that the input circuit is employed for the electronic measurement apparatus, the measurement is allowed in the large voltage range over the wide band of frequency without an influence on the measured system because of the high input impedance.

Further, in the case that the input circuit is employed for the signal processor, the signal processing is allowed in the large voltage range over the wide band of frequency without having influence on the signal outputting system because of the high input impedance.

DETAILED DESCRIPTION OF THE PREFERRED EMBODIMENTS

An embodiment of the present invention will be described below with reference to the accompanying drawings.

Figure 1:
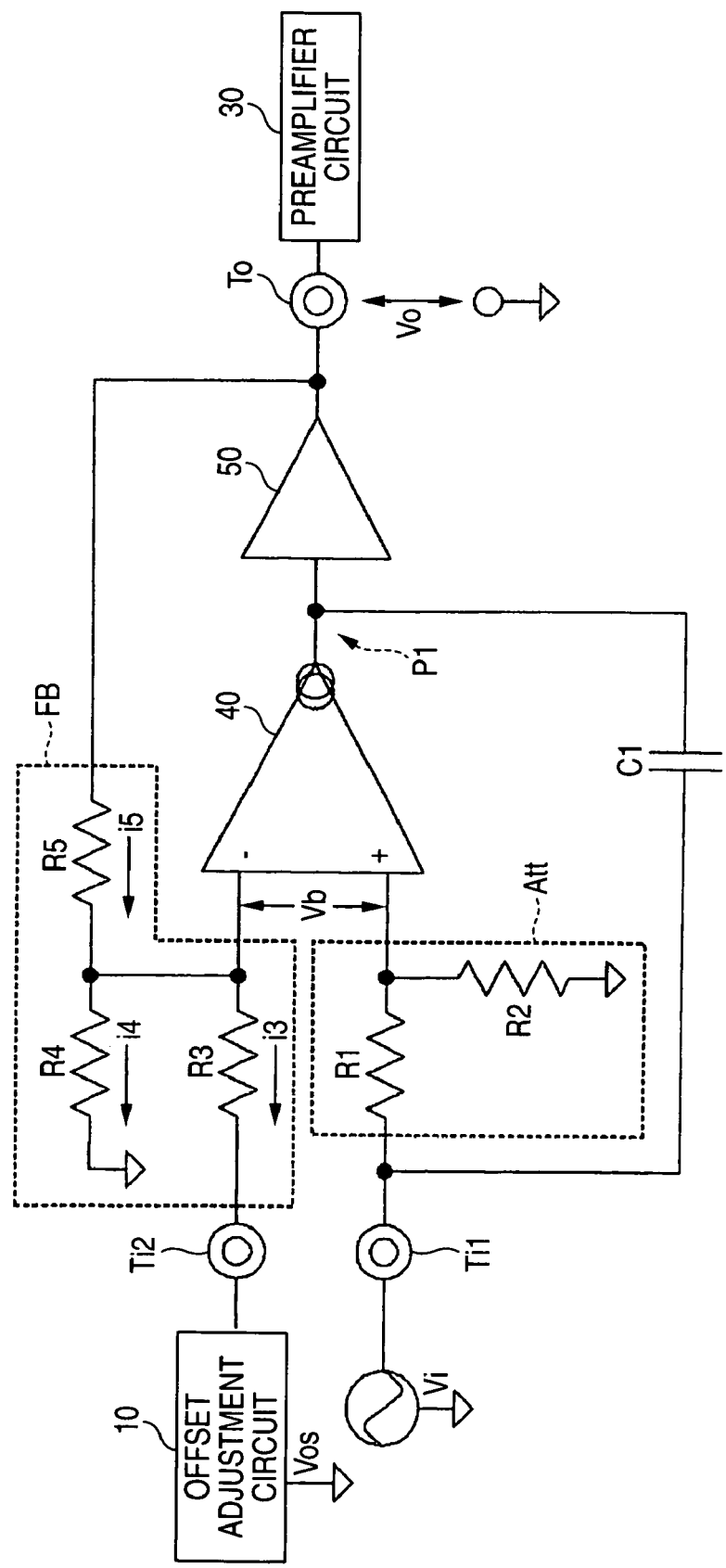
FIG. 1 is a block diagram showing an input circuit according to an embodiment of the present invention.
Figure 2:
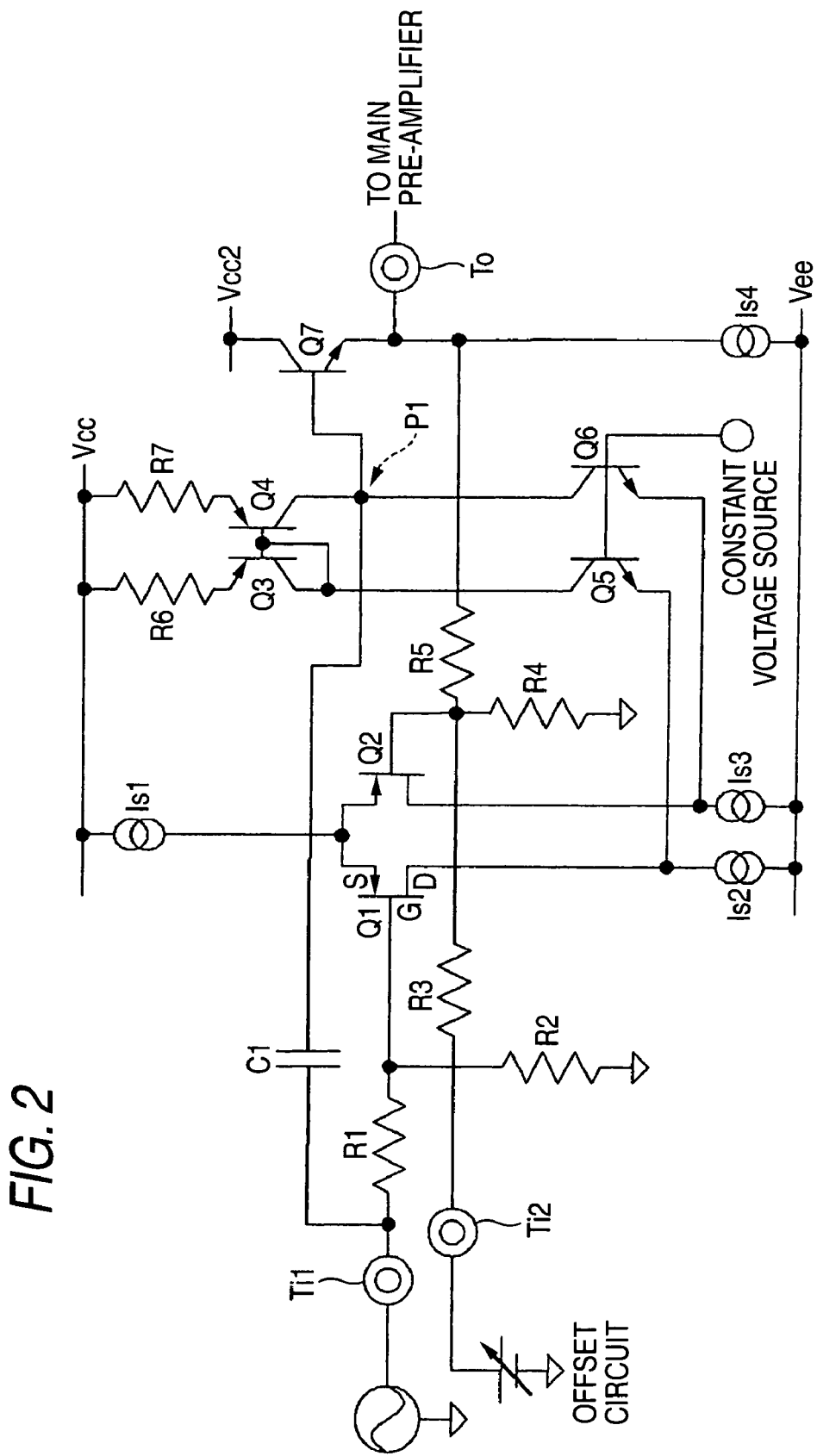
FIG. 2 is a circuit diagram showing the input circuit according to the embodiment of the invention.
Figure 3:
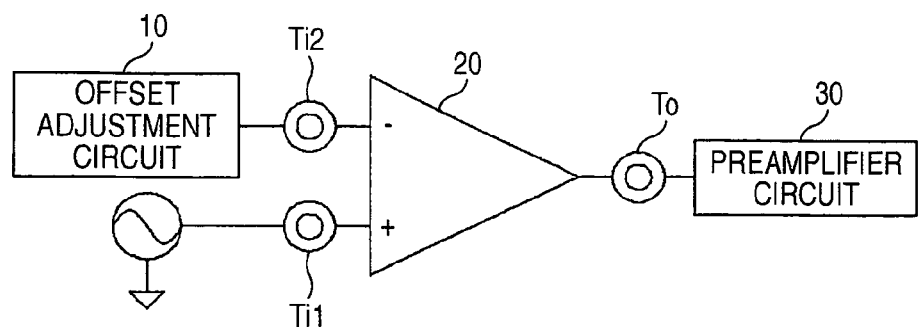
FIG. 3 is a block diagram of an electronic measurement apparatus using a conventional input circuit.
Figure 4:
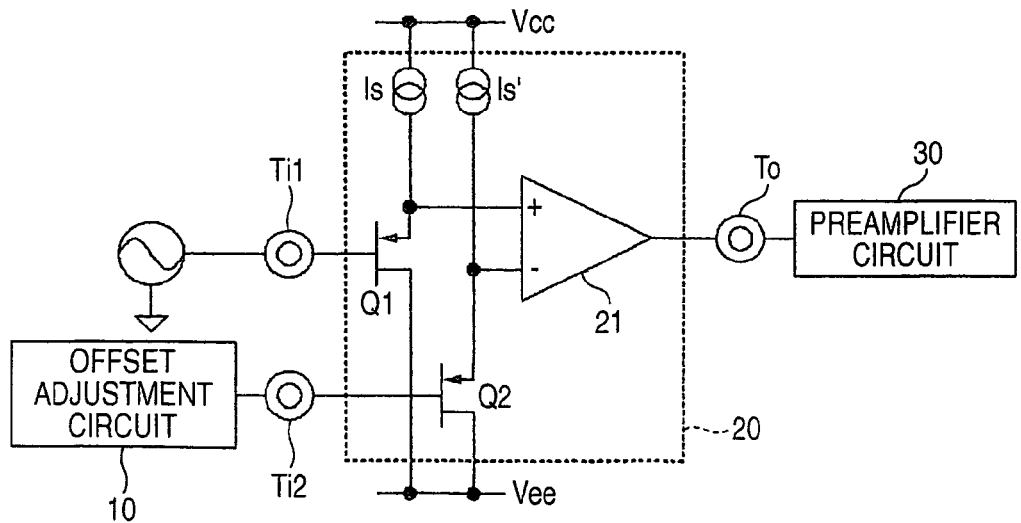
FIG. 4 is a circuit diagram of the conventional input circuit.

FIG. 1 is a block diagram showing an input circuit according to one embodiment of the invention. FIG. 2 is a circuit diagram of the input circuit as shown in FIG. 1. The same reference numbers will be used throughout the drawings to refer to the same or like parts. The description for the parts as already described in FIGS. 3 and 4 is omitted here. A differential amplification circuit 40 in place of the differential amplification circuit 20, a buffer 50, an attenuation circuit Att, a feedback circuit FB, and a capacitor C1 are provided. The differential amplification circuit 40 has a differential pair of p-channel MOS-FETs at the first stage, with two inputs and one output, and converts a differential signal into a single end signal to output the current. The buffer 50 has the input side connected to the output side of the differential amplification circuit 40, and the output side connected to the output terminal To.

The attenuation circuit Att is configured from a first resistor R1 and a second resistor R2, and attenuates the voltage of a measuring signal (first input signal) from one input terminal Ti1 to output the attenuated signal to the differential amplification circuit 40. The resistor R1 has one end connected to the input terminal Ti1, and the other end connected to one input side (non-reversal input side) of the differential amplification circuit 40. The resistor R2 has one end connected to the common potential point, and the other end connected to the other end of the resistor R1. It is preferred that in the oscilloscope, the resistors R1, R2 have the almost same resistance values (i.e., attenuation factor ½), with the input impedance for the DC signal set to 1 [MΩ].

The feedback circuit FB is configured from a third resistor R3, a fourth resistor R4 and a fifth resistor R5, and feeds back an output signal from the buffer 50 to output it together with an offset signal (second input signal) from the other input terminal Ti2 to the differential amplification circuit 40. The resistor R3 has one end connected to the input terminal Ti2, and the other end connected to the other input side (reversal input side) of the differential amplification circuit 40. The resistor R4 has one end connected to the common potential point, and the other end connected to the other end of the resistor R3. The resistor R5 has one end connected to the output side of the buffer 50, and the other end connected to the other end of the resistor R3.

The capacitor C1 is provided in parallel to the attenuation circuit Att and the differential amplification circuit 40, with one end connected to the input terminal Ti and the other end connected to the output side (i.e., input side of the buffer 50) of the differential amplification circuit 40. In this way, since the capacitor C1 is provided in parallel to the attenuation circuit Att and the differential amplification circuit 40, a composite amplifier is constructed. A synthesis point P1 is a point at which the single end signal configured from a DC signal outputted from the differential amplification circuit 40 and a low frequency signal having a relatively low frequency (about several hundreds [MHz]) and a high frequency signal bypassed by the capacitor are synthesized. Herein, the input circuit comprises the input terminals Ti1, Ti2, the output terminal To, the capacitor C1, the differential amplification circuit 40, the buffer 50, the attenuation circuit Att, and the feedback circuit FB.

The details of the differential amplification circuit 40 and the buffer 50 will be described below.

A pair of p-channel MOS-FETs Q1, Q2 are provided at the first stage of the differential amplification circuit 40, with the source connected via a constant current source Is1 to the power cable Vcc. An FET Q1 has the gate connected to the other end of the resistor R1 at one input side of the amplification circuit 40, and the drain connected via a constant current source Is2 to the power cable Vee. An FET Q2 has the gate connected to the other end of the resistor R3 at the other input side of the amplification circuit 40, and the drain connected via a constant current source Is3 to the power cable Vee. The frequency characteristic of the FET Q1, Q2 may not conform with the high frequency signal, as in the circuit as shown in FIG. 4. Also, the capacity of the capacitor C1 is chosen to have the appropriate frequency characteristic.

The resistors R6, R7 have one end connected to the power cable Vcc. A pnp transistor Q3 has the emitter connected to the other end of the resistor R6, and the base connected to the collector. A pnp transistor Q4 has the emitter connected to the other end of the resistor R7, the base connected to the base of the transistor Q3, and the collector connected to the other end (i.e., synthesis point P1) of the capacitor C1. In this way, the transistors Q3, Q4 make up a current mirror circuit.

The npn transistors Q5, Q6 have the collector connected to the collector of the transistors Q3, Q4, the base connected to the common potential point, and the emitter connected via the constant current source Is2, Is3 to the power cable Vee to make a folded cascade connection. The base may be connected to the constant voltage source at a desired voltage level, rather than the common potential point.

An npn transistor Q7 has the collector connected to the power cable Vcc2, the base connected to the other end (i.e., synthesis point P1) of the capacitor C1, and the emitter connected via a constant current source Is4 to the power cable Vee and to one end (i.e., output terminal To) of the resistor R5. The transistors Q3 to Q7 are the bipolar transistors. Also, the voltage levels of the power cables Vcc, Vcc2 and Vee have the relation "Vcc≧Vcc2>Vee."

Herein, the differential amplification circuit 40 is configured from the FETs Q1, Q2, the transistors Q3 to Q6, the constant current sources Is1 to Is3, and the resistors R6, R7. The buffer 50 configured from the transistor Q7 and the constant current source Is4 is the emitter follower type.

The input/output relation of the input circuit will be described below in terms of the specific values.

Supposing that the voltage of a measuring signal is Vin, the voltage of an offset signal is Vos, the voltage of an output signal is Vo, the voltage inputted into the reversal input side and non-reversal input side of the differential amplification circuit 40 at the time of virtual short is Vb, and the currents flowing through the resistors R3 to R5 are i3 to i5, the following equations (1) to (4) are obtained.

$$i5=i3+i4 \quad (1)$$

$$Vo-Vb=i5 \times R5 \quad (2)$$

$$Vb-0=i4 \times R4 \quad (3)$$

$$Vb-Vos=i3 \times R3 \quad (4)$$

Accordingly, the following equation (5) results from the above equations (1) to (4).

$$Vo=((R3 \times R5+R4 \times R5+R4 \times R3)/(R3 \times R4)) \times Vb-(R5/R3) \times Vos \quad (5)$$

If the resistors R1=530 [kΩ] and R2=470 [kΩ], Vb=0.47Ω×Vin. Also, if the resistors R3=8.51 [kΩ], R4=12.12 [kΩ] and R5=5 [kΩ], the input/output relation of the input circuit is given by the following equation (6).

$$Vo=0.94 \times (Vin-Vos/1.6) \quad (6)$$

The operation of this circuit will be described below.

In the current mirror circuit configured from the transistors Q3, Q4, a current flows through the power cable Vcc, the resistor R6, and the transistors Q3, Q5 from the constant current sources Is2 and Is3. Similarly, a current flows through the power cable Vcc, the resistor R7 and the transistors Q4, Q6.

First of all, a measuring signal inputted into the input terminal Ti1 will be described.

The voltage of the measuring signal from the input terminal Ti1 is attenuated by the attenuation circuit Att. And the attenuated measuring signal is applied to the gate of the FET Q1 in the differential amplification circuit 40. A current amount flowing between source and drain of the FET Q1 is changed in accordance with the voltage applied to the gate. The FET Q1 controls the current amount between source and drain in correspondence with only the DC signal and the low frequency signal of the measuring signal.

And the current amount flowing between emitter and collector of the transistors Q3, Q4 making up the current mirror circuit, as well as the current amount flowing through the synthesis point P1, are also changed in accordance with the current amount between source and drain of the FET Q1.

On the other hand, the high frequency signal of the measuring signal from the input terminal Ti1, which is not treated by the FET Q1, is transferred via the capacitor C1 bypassing the high frequency signal to the synthesis point P1.

In this way, the DC signal and the low frequency signal are transferred through the attenuation circuit Att and the differential amplification circuit 40 to the synthesis point P1, and the high frequency signal not transferable by the differential amplification circuit 40 is transferred through the capacitor C1 to the synthesis point P1. That is, the frequency characteristic of the signal transferred from the input terminal Ti1 to the synthesis point P1 is flat, so that all the signals inputted into the input terminal Ti1, including the DC signal and the high frequency signal, are correctly transferred to the synthesis point P1. And the emitter voltage of the transistor Q7 in the buffer 50 is controlled by the signal transferred to the synthesis point P1, so that the voltage corresponding to the measuring signal at the input terminal Ti1 is outputted as the output signal to the output terminal To.

The offset signal inputted into the input terminal Ti2 will be described below.

The voltage level of the offset signal (normally DC signal) from the input terminal Ti2 is attenuated by the feedback circuit FB, and applied to the gate of the FET Q2 in the differential amplification circuit 40, whereby the current amount flowing between source and drain of the FET Q2 is changed in accordance with the voltage applied to the gate.

And the current amount flowing between emitter and collector of the transistor Q4, as well as the current amount flowing through the synthesis point P1, are also changed in accordance with the current amount between source and drain of the FET Q2. Moreover, the emitter voltage of the transistor Q7 in the buffer 50 is controlled by the signal transferred to the synthesis point P1. Since the feedback circuit FB is connected to the output terminal To, the voltage according to the offset signal at the input terminal Ti2 is outputted as the output signal to the output terminal To.

Accordingly, the output signal that is a voltage of the measuring signal subtracted (or added) by a voltage of the offset signal is outputted via the output terminal To to the preamplifier circuit 30.

In this way, since the capacitor C1 is provided in parallel to the attenuation circuit Att and the differential amplification circuit 40 to construct a composite amplifier using the differential amplification circuit 40 and the capacitor C1, it is possible to transfer the high frequency signal which is incapable of transferring through the differential amplification circuit 40. Further, since the attenuation circuit Att attenuates the measuring signal into the differential amplification circuit 40, the input voltage range for the differential amplification circuit 40 is increased. Thus, the input circuit has the frequency characteristic over the wide band, including the direct current signal, and the large input voltage range, with the high input impedance. Accordingly, it is unnecessary that the FETs Q1, Q2 at the first stage of the differential amplification circuit 40 are expensive ordered products, whereby the cost is reduced.

Further, the feedback circuit FB feeds back the output signal, and can stably output the offset signal to the differential amplification circuit 40. Therefore, it is possible to stably perform the differential amplification between the measuring signal and the offset signal.

Further, since the attenuation circuit Att is only configured from the resistors R1, R2, it is possible to double the voltage adjustment range of the offset signal and the input voltage range from the measuring signal while maintaining the high input impedance.

Further, since the feedback circuit FB has one end of the resistor R4 connected to the common potential point to attenuate the offset signal, the influence of the noise in the offset signal reduces.

Further, since a differential pair of p-channel MOS-FETs Q1, Q2 are employed at the first stage of the differential amplification circuit 40, the high input impedance is realized.

Further, since the high frequency component signal is transferred through the capacitor C1, the measuring signal can be transferred to the buffer 50 with the constant characteristic without depending on the frequency, even if the high frequency component signal not transferable by the differential amplification circuit 40 is included in the measuring signal from the measured system.

Moreover, by employing the input circuit for the electronic measurement apparatuses such like the oscilloscope, the input circuit has the high input impedance, allowing for the measurement in the large voltage range over the wide band of frequency without having the influence on the measured system.

The present invention is not limited to the above embodiment, but may be made in the following way.

Though the input circuit as shown in FIGS. 1 and 2 is employed for the electronic measurement apparatuses, including the oscilloscope, it may be applied to the signal processor for performing the signal processing of the electric signal. Thus, owing to the high impedance, it is possible to perform the signal processing in the large voltage range over the wide band of frequency without having the influence on the system for outputting the signal.

Though the specific resistance values of the resistors R1 to R5 are indicated, the optimal resistance values may be adopted in accordance with the input signal or the circuit at the latter stage.

Also, though the offset signal is inputted into the input terminal Ti2 in the above embodiment, any other signal may be inputted.

Moreover, though the preamplifier circuit 30 is provided at the latter stage of the buffer 50, any other circuit may be provided.

What is claimed is:

1. An input circuit, comprising:
  a first input terminal to which a first input signal is inputted;
  a second input terminal to which a second input signal is inputted;
  an output terminal from which an output signal acquired by performing differential amplification between the first input signal and the second input signal is outputted;
  a differential amplification circuit which converts a differential signal into a single end signal to output the single end signal;
  an attenuation circuit which attenuates the first input signal to output the attenuated signal to the differential amplification circuit;
  a capacitor in which one end thereof is connected to the first input terminal, and another end thereof is connected to an output side of the differential amplification circuit;
  a buffer to which the single end signal outputted from the differential amplification circuit and a signal transmitted through the capacitor are inputted, and which outputs the output signal; and a feedback circuit which outputs a signal based on the output signal outputted from the buffer and the second input signal to the differential amplification circuit.

2. The input circuit according to claim 1, wherein the attenuation circuit has:

a first resistor in which one end thereof is connected to the first input terminal, and another end thereof is connected to an input side of the differential amplification circuit; and a second resistor in which one end thereof is connected to a common potential point, and another end thereof is connected to the another end of the first resistor.

3. The input circuit according to claim 1, wherein the feedback circuit has:

a first resistor in which one end thereof is connected to the second input terminal, and another end thereof is connected to an input side of the differential amplification circuit;

a second resistor in which one end thereof is connected to a common potential point, and another end thereof is connected to the another end of the first resistor; and a third resistor in which one end thereof is connected to an output side of the buffer, and another end thereof is connected to the another end of the first resistor.

4. The input circuit according to claim 1, wherein the differential amplification circuit has a differential pair of p-channel MOS-FETs at a first stage, wherein the signal outputted from the attenuation circuit is inputted to a gate of one of the MOS-FETs, and the signal outputted from the feedback circuit is inputted to a gate of another MOS-FET.

5. The input circuit according to claim 1, wherein the signal inputted to the buffer through the capacitor is a signal of high frequencies in the first input signal, which is incapable of transferring through the differential amplification circuit.

6. The input circuit according to claim 1, wherein the second input signal is an offset signal which makes an offset adjustment for the first input signal.

7. The input circuit according to claim 1, wherein the input circuit is employed for an electronic measurement apparatus which measures an electric signal.

8. The input circuit according to claim 1, wherein the input circuit is employed for a signal processor which performs a signal processing of an electric signal.

* * * * *